United States Patent [19]

Woolf et al.

[11] Patent Number: 5,006,507
[45] Date of Patent: Apr. 9, 1991

[54] NICKEL-BASED SUBSTRATE FOR CERAMIC SUPERCONDUCTOR

[75] Inventors: Lawrence D. Woolf, Carlsbad; Frederick H. Elsner, Cardiff; William A. Raggio, Del Mar, all of Calif.

[73] Assignee: General Atomics, San Diego, Calif.

[21] Appl. No.: 339,013

[22] Filed: Apr. 14, 1989

[51] Int. Cl.$^5$ .............................................. B32B 9/00
[52] U.S. Cl. .................................... 505/1; 505/701; 505/702; 505/703; 505/704; 428/457; 428/688; 428/930
[58] Field of Search .......................... 505/1, 701–704; 29/599; 428/209, 457, 688, 930

[56] References Cited

PUBLICATIONS

"Thermal Spraying Superconducting Oxide Coatings" by Kirkland et al., Advanced Ceramic Materials, vol. 2, No. 3B, Special Issue 1987, pp. 401–410.
"Large Area Plasma Spray Deposited Superconducting YBa$_2$Cu$_3$O$_7$ Thick Films" by Cuomo et al., Advanced Ceramic Materials, vol. 2, No. 3B, Special Issue 1987, pp. 422–429.
"High Tc Superconducting Films of Y-Ba-Cu Oxides Prepared by Low-Pressure Plasma Spraying" by Tachikawa et al., Applied Physics Letter 52(12), Mar. 21, 1988, pp. 1011–1013.
"Reaction of Ba$_2$YCu$_2$O$_{6.9}$ Films with Yttria-Stabilized Zirconia Substrates" by Cima et al., Applied Physics Letters 53(8), Aug. 1988, pp. 710–712.
"High Tc Superconductivity in Y—Ba—Cu—O Screen-Printed Films" by Sacchi et al., Applied Physics Letter 53(12), Sep. 19, 1988, pp. 1110–1112.
"Interdiffusion and Interfacial Reaction Between a YBa$_2$Cu$_3$O$_x$ Thin Film and Substrates" by Nakajima et al., Applied Physics Letter 53(15), Oct. 10, 1988, pp. 1437–1439.
"Lanthanum Gellate Substrates for Epitaxial High-Temperature Superconducting Thin Films" by Sandstrom et al., Applied Physics Letter 53(19), Nov. 7, 1988, pp. 1874–1876.
"Processing Techniques for the 93K Superconductor Ba$_2$YCu$_3$O$_7$" by Murphy et al., Science, vol. 241, Aug. 19, 1988, pp. 922–930.
"On The New Substrate Materials for High Tc Superconducting Ba—Y—Cu—O Thin Films" by Komatsu et al., Japanese Journal of Applied Physics, vol. 27, No. 9, Sep. 1988, pp. L1686–L1689.
CA 82(26):179651f, Siemens A. G., 11-20-72, TrinohiumsTannane coated Superconductors.

Primary Examiner—Patrick Ryan
Attorney, Agent, or Firm—Neil K. Nydegger

[57] ABSTRACT

A ceramic superconductor comprises a substantially nonmagnetic preannealed nickel-based alloy substrate which supports a ceramic superconductor. The substrate may include aluminum to strengthen the substrate and make it less magnetic. The substrate is substantially devoid of minority constituent oxide shell formers and the ceramic is formed on the substrate by sintering superconductor grains at temperatures above 1000° C. to enhance densification of the ceramic.

25 Claims, 1 Drawing Sheet

NICKEL-BASED SUBSTRATE FOR CERAMIC SUPERCONDUCTOR

FIELD OF THE INVENTION

This invention relates to superconductors. More particularly, the present invention relates to ceramic superconductors which are supported on a chemically compatible, substantially nonmagnetic substrate. The present invention is particularly, but not exclusively, useful in applications such as magnet windings for a superconducting magnet.

BACKGROUND OF THE INVENTION

As is well known in the pertinent art, superconductors can be relatively easily manufactured as a ceramic for use in several applications. However, since the superconductor lacks sufficient inherent strength to be handled easily, it must be supported by a substrate during its use. Furthermore, a substrate is needed during the manufacture of the ceramic superconductor to provide a base on which the unsintered grains of superconductor material can be coated. Unfortunately, the extreme changes between manufacturing temperatures and operational temperatures affect both the chemical and the physical interaction between the substrate and the ceramic.

As used here, chemically compatibility means an essentially inert relationship wherein there is little, if any, interdiffusion between the ceramic superconductor and the substrate. With this definition, chemical compatibility between the substrate and the superconductor is important for at least two reasons. First, the diffusion of substrate constituents into the superconductor material will dope the superconductor with foreign elements which invariably poison the superconductor. The result is a superconductor which has a lower critical temperature ($T_c$) and also a reduced critical current density ($J_c$). Second, the diffusion of superconductor material from the superconductor into the substrate may change the desirable characteristics of the substrate, e.g. embrittle the substrate. Thus, interdiffusion should be prevented, or at least minimized. One solution is to select substrate materials having minority constituents which form oxide shells such as those disclosed in co-pending patent application Ser. No. 265,827 for an invention entitled "Substrate for Ceramic Superconductor" and our co-pending application for an invention entitled "Substrate for Ceramic Superconductor with Improved Barrier," both of which are assigned to the same assignee as the present invention. Another, solution is to select a substrate material which is inherently chemically compatible with the superconductor material. With this characteristic in mind, it has been determined that one such material is nickel (Ni). Pure nickel (Ni), however, is more magnetic at the cryogenic operating temperatures of superconductor materials than is desirable for some contemplated applications. Further, nickel (Ni) is more magnetic than desirable at the room temperature conditions which may be used for magnetic grain alignment fabrication of the ceramic superconductor.

Physical compatibility between the substrate and the superconductor is also important. Specifically, the substrate must be able to support the superconductor ceramic without putting undue stresses on the ceramic. This requires consideration of the respective coefficients of thermal expansion of the substrate and the superconductor, as well as the stability of the substrate. Moreover, these considerations apply over a very wide temperature range and a variety of operating configurations. Insofar as the respective coefficients of thermal expansion are concerned, it is preferable that the ceramic be placed in compression when the combination of substrate and ceramic superconductor is cooled.

The magnetic properties of the substrate are also of great importance. Particularly, there is a need for a nonmagnetic or weakly magnetic substrate when the superconductor is to be used as a magnet winding. Otherwise, the magnetic field generated by the magnet windings can be distorted. Also, there is a need for a nonmagnetic substrate if the substrate is to be coated with grains of superconductor material by an electrophoresis process such as is disclosed in our co-pending patent application Ser. No. 289,968 for an invention entitled "Apparatus and Method for Manufacturing a Ceramic Superconductor Coated Metal Fiber," and which is assigned to the same assignee as the present invention. This is so in order not to perturb the grain aligning magnetic field in the vicinity of the substrate wire and thus prevent a noncircular coating.

In light of the above, it is an object of the prevent invention to provide a substrate for a ceramic superconductor which is inherently substantially chemically compatible with the ceramic. Another object of the present invention is to provide a ceramic superconductor substrate which can support the ceramic without placing undue stresses on it. Yet another object of the present invention is to provide a ceramic superconductor substrate which is substantially as chemically compatible with the superconductor as is pure nickel but which is less magnetic than pure nickel. Still another object of the prevent invention is to provide a substantially nonmagnetic ceramic superconductor substrate. Yet another object of the present invention is to provide a superconductor that is relatively easy to manufacture and comparatively cost effective.

SUMMARY OF THE INVENTION

The preferred embodiment of the novel ceramic superconductor of the present invention comprises a metallic substrate which is chemically compatible with the particular superconductor material being used. This compatibility, i.e. minimal interdiffusion between substrate and superconductor layer, exists throughout the range of temperatures to which the substrate-superconductor combination must be exposed in order to form a ceramic superconductor coating with desirable properties.

Preferably, the substrate is a substantially nonmagnetic annealed nickel-based alloy which is identified as $Ni_{1-x}Al_x$, where $0 \leq x \leq 0.25$ or, alternatively, as $Ni_x Al_y Cu_z$, where $0.6 \leq x$, $0 \leq y \leq 0.25$, and $\leq z \leq 0.15$. Further, it is important that the substrate have no minority constituent oxide formers which will form an oxide shell on the surface of the substrate at elevated temperatures. On the other hand, it may be desirable to precoat the substrate with an extremely thin oxide layer, such as yttrium oxide, in order to further inhibit the already slight interdiffusion of material between substrate and superconductor layer.

The substrate can have any of several configuration. For example, and to name but a few, the substrate may be a wire, a plate, a ribbon, or a tube. The ceramic superconductor layer is preferably made from grains of the so-called 1-2-3 superconductor $REBa_2Cu_3O_7$, where RE=Y or some other rare earth element. Also it is preferable that the superconductor be sintered in place on the substrate at temperatures in the range of 970° C. to 1030° C. for one (1) to fifteen (15) minutes.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
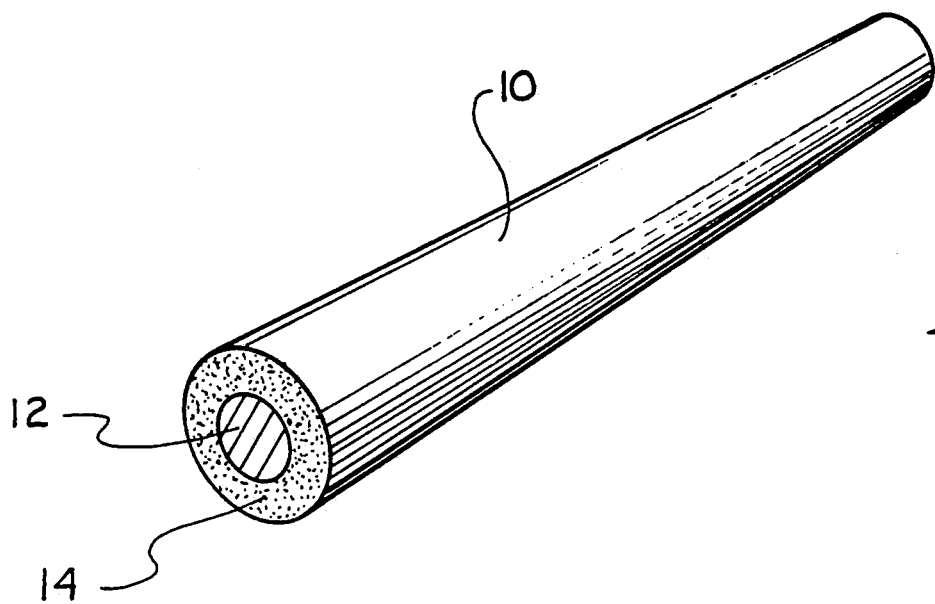
FIG. 1 is a perspective view of a wire superconductor with a portion shown in cross section.

Referring initially to FIG. 1, it will be seen that a wire superconductor 10 comprises a substrate 12 which supports a ceramic superconductor layer 14. Preferably, the ceramic superconductor layer 14 is a composition familiarly referred to as a 1-2-3 superconductor from the group identified as RE $Ba_2Cu_3O_{7-x}$ (where x is in the range 0-1.0). For the present invention, substrate 12 is a nickel based alloy which includes aluminum that is added to give strength to the substrate 12 and make it less magnetic.

Suitable compositions for substrate 12 include $Ni_{1-x}Al_x$ (where $0 \leq x \leq 0.25$) and $Ni_xAl_yCu_z$ (where; $0.6 \leq x$, $0 \leq y \leq 0.25$, and $0 \leq z \leq 0.15$). When $x > 0.15$ a special situation may be encountered. Although for most applications the present invention contemplates there will be a very thin, if any, oxide shell formed by the substrate itself, it is recognized that for $Ni_{1-x}Al_x$ with $x > 0.15$, the material is substantially equivalent to what is assumed to be an oxide former ($Ni_3Al$). The $Ni_{1-x}Al_x$ material wherein x is approximately 0.1, is however, preferred. It happens that a modification of this preferred $Ni_{90}Al_{10}$ material is commercially available and is sold as DURANICKEL Alloy 301 by Huntington Alloys. Importantly, it has been found that $Ni_{90}Al_{10}$ is chemically compatible with the 1-2-3 superconductor material used for wire superconductor 10. For all suitable substrate materials, it is to be appreciated that some minor constituents may be added if desired. For example, DURANICKEL Alloy 301 includes some minor constituents. In general, some suitable minor constituents could be silicon (Si), titanium (Ti), manganese (Mn) and beryllium (Be). These minor constituents may also make the Ni-Al alloy even less magnetic. Typical amounts of minority constituents which might be useful for this purpose could be on the order of one half to five (0.5-5) weight percent of the alloy.

In addition to its chemical compatibility with 1-2-3 superconductors, $Ni_{90}Al_{10}$ and DURANICKEL 301 have other favorable characteristics. For one thing, they are considerably less magnetic than pure nickel. Also, for certain situations, such as when the substrates are to be coated using magnetic field electrophoresis, the substrate wires can be made even less magnetic by heating them above their Curie temperatures of approximately 50° F. to 150° F. Further, their thermal expansion characteristics compare favorably with those of the superconductor layer 14 throughout the temperature range to which the combination will be subjected. Very importantly, however, in order to ensure the stability of the substrate 12 throughout these temperature excursions, the substrate 12 must be in the annealed condition before being coated with ceramic superconductor, i.e. preannealed. Specifically, it has been found that when using an unannealed nickel wire for substrate 12, which is slightly curved when it is removed from its spool, the substrate 12 will anneal, and thus straighten out at temperatures below these required for properly sintering the superconductor ceramic. Consequently, the superconductor layer 14 is invariably stressed to a point where it will crack. On the other hand, with a preannealed material this problem is obviated.

The $Ni_xAl_yCu_z$ material exhibits characteristics similar to those described above for $Ni_{1-x}Al_x$. Depending on its composition, it may even be less magnetic. Importantly, it too should be preannealed.

Figure 2:
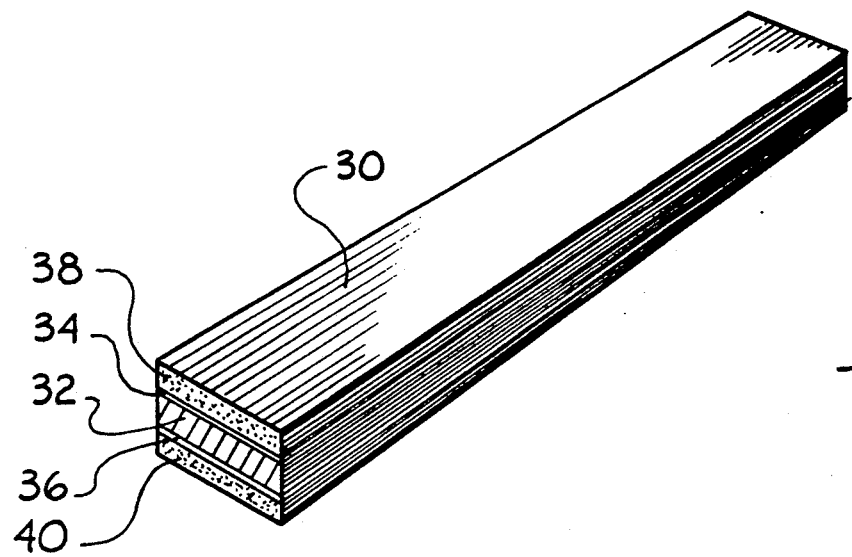
FIG. 2 is a perspective view of a tube superconductor with a portion shown in cross section.

FIG. 2 shows a tubular shaped superconductor 20 in which a tube substrate 22 has been filled with superconductor material 24. Although FIG. 2 shows a configuration wherein the lumen of tube substrate 22 is completely filled with superconductor material 24, it is to be appreciated that tube substrate 22 could have a sufficiently large diameter lumen to permit a coating of the lumen surface rather than a complete filling of the lumen.

Figure 3:
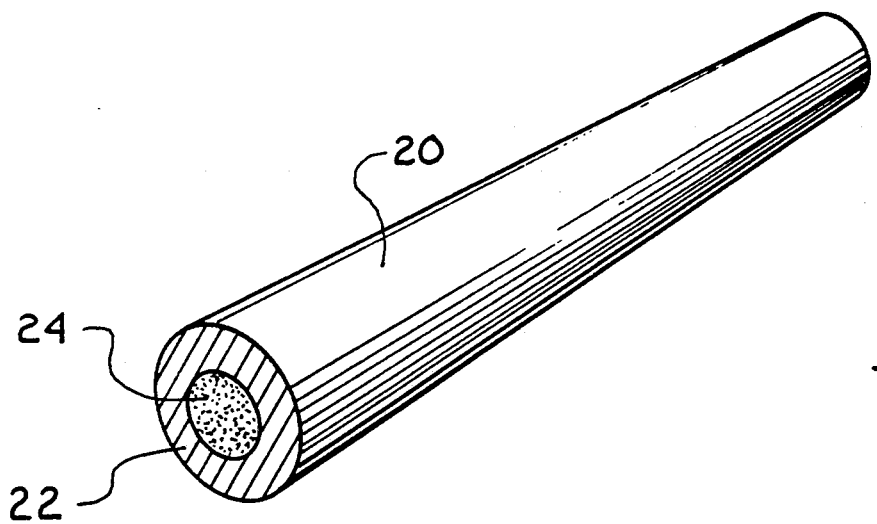
FIG. 3 is a perspective view of a precoated ribbon or plate superconductor with a portion shown in cross section.

Since neither $Ni_{1-x}Al_x$ nor $Ni_xAl_yCu_z$ have minority constituent oxide shell formers, and although oxide shells are normally not needed with these substrate materials, it may nevertheless be desirable to have a thin oxide shell between the substrate and superconductor to further inhibit the probability of interdiffusion. FIG. 3 shows a flat superconductor 30 which has such a shell. Specifically, FIG. 3 shows a substantially flat or ribbon-shaped substrate 32 which has a precoat oxide shell layer 34 on one of its surfaces and a precoat oxide shell layer 36 on the opposite surface. Ceramic superconductor layers 38 and 40 are respectively supported on precoat layers 34 and 36 by the substrate 32.

It is to be appreciated that substrates 12, 22 and 32 are all preferably preannealed $Ni_{1-x}Al_x$, specifically DURANICKEL 301 is preferred, and that the superconductor layers 14, 24, 38 and 40 are all preferably a so-called 1-2-3 superconductor. Further, substrates 12, 22 and 32 can be thin and have a relatively small cross-sectional area. For example, wire substrate 12 can have a substantially circular cross section with a diameter in the range of one (1) mil to twenty (20) mils. It is particularly important with substrates 12 in this size range that the material used for the substrate be preannealed.

Although the manufacture of superconductor devices as discussed above may be with reference to a particular configuration, it is to be understood that the manufacture is substantially the same regardless of substrate configuration. For example, if it is desired to manufacture a substrate precoated with a thin oxide layer, the substrate is first coated with a substrate such as yttrium alkoxide. After hydrolyzed the yttrium alkoxide to form yttrium hydroxide, the coated substrate is then fired to approximately 400° C. in an oxidizing environment and maintained at that temperature for approximately one (1) hour to form a thin layer of yttrium oxide on the substrate. Similar processes such as vapor deposition processes, well known in the art, can be followed to coat the substrate with other oxide layers such as zirconium oxide or a rare earth oxide.

Subsequently, the substrate with its precoat oxide layer is then coated with grains of superconductor material. This coating of the substrate with superconductor material can be accomplished in any of several ways, such as by the electrophoresis process disclosed in our co-pending application cited above. The superconductor grains which have been coated on the substrate are then sintered on the substrate at temperatures in the range of 970° C. to 1030° C. for a period of from one (1) to fifteen (15) minutes. At these temperatures, the ceramic achieves greater densification than can be attained at the lower, more commonly used sintering temperatures in the range of 960° C., particularly for grains without lower melting eutectic liquid phases. It will be appreciated that the precoat may not be considered necessary. In that case, a preannealed nonmagnetic nickel based substrate is simply coated with grains of superconductor material and these grains are sintered on the substrate as disclosed above.

While the particular ceramic superconductor as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. A ceramic superconductor which comprises:
   an aluminum containing nickel based alloy substrate wherein said substrate is identified as Ni1-Alx and wherein x is greater than zero and less than or equal to twenty-five one hundredths ($0 \leq X \leq 0.25$); and
   an oxygen-containing ceramic superconductor layer supported on said substrate.

2. A ceramic superconductor as recited in claim 1 wherein x is approximately equal to one tenth (0.1).

3. A ceramic superconductor as recited in claim 1 wherein said substrate is a material identified as $Ni_x Al_y Cu_z$.

4. A ceramic superconductor as recited in claim 1 wherein said substrate is a wire.

5. A ceramic superconductor as recited in claim 1 wherein said substrate is a flat ribbon.

6. A ceramic superconductor as recited in claim 1 wherein said substrate is a plate.

7. A ceramic superconductor as recited in claim 1 wherein said substrate is a tube.

8. A ceramic superconductor as recited in claim 1 wherein said substrate is substantially devoid of minority constituent oxide shell formers.

9. A ceramic superconductor as recited in claim 1 further comprising a precoat layer deposited on said substrate between said ceramic superconductor layer and said substrate.

10. A ceramic superconductor as recited in claim 9 wherein said precoat layer is yttrium oxide.

11. A ceramic superconductor as recited in claim 9 wherein said precoat layer is a rare earth oxide.

12. A ceramic superconductor as recited in claim 9 wherein said precoat layer is zirconium oxide.

13. A ceramic superconductor as recited in claim 1 wherein said substrate is preannealed.

14. A ceramic superconductor as recited in claim 1 further comprising a nickel oxide layer on the surface of said substrate between said substrate and said superconductor layer.

15. A ceramic superconductor as recited in claim 1 wherein said substrate is substantially nonmagnetic.

16. A ceramic superconductor which comprises:
    a preannealed aluminum containing nickel substrate having a small cross-sectional area; and
    an oxygen-containing ceramic superconductor layer supported on said substrate.

17. A ceramic superconductor as recited in claim 16 wherein said substrate is a wire.

18. A ceramic superconductor as recited in claim 16 wherein said substrate is a flat ribbon.

19. A ceramic superconductor as recited in claim 16 wherein said substrate is a tube.

20. A ceramic superconductor as recited in claim 16 further comprising a precoat layer deposited on said substrate between said ceramic superconductor layer and said substrate.

21. A ceramic superconductor as recited in claim 20 wherein said precoat layer is yttrium oxide.

22. A ceramic superconductor as recited in claim 20 wherein said precoat layer is a rare earth oxide.

23. A ceramic superconductor as recited in claim 20 wherein said precoat layer is zirconium oxide.

24. A ceramic superconductor as recited in claim 1 wherein said substrate further comprises minor constituents from the group Silicon(Si), Titanium(Ti), Manganese(Mn), and Beryllium(Be) and said minor constituents are less than five (5) weight percent of said substrate.

25. A ceramic superconductor as recited in claim 16 wherein said substrate further comprises minor constituents from the group Silicon(Si), Titanium(Ti), Manganese(Mn) and Beryllium(Be) and said minor constituents are less than five (5) weight percent of said substrate.

* * * * *